US012745602B2

(12) United States Patent
Vaillant et al.

(10) Patent No.: US 12,745,602 B2
(45) Date of Patent: Sep. 22, 2026

(54) MULTI-WAFER HANDLING SYSTEM

(71) Applicant: TEL Manufacturing and Engineering of America, Inc., Chaska, MN (US)

(72) Inventors: Jeremy John Vaillant, Holden, MA (US); Matthew Charles Gwinn, Winchendon, MA (US)

(73) Assignee: TEL Manufacturing and Engineering of America, Inc., Chaska, MN (US)

( * ) Notice: Subject to any disclaimer, the term of this patent is extended or adjusted under 35 U.S.C. 154(b) by 299 days.

(21) Appl. No.: 18/442,926

(22) Filed: Feb. 15, 2024

(65) Prior Publication Data

US 2025/0266285 A1 Aug. 21, 2025

(51) Int. Cl.
*H10P 72/76* (2026.01)

(52) U.S. Cl.
CPC ...... *H10P 72/7608* (2026.01); *H10P 72/7606* (2026.01); *H10P 72/7614* (2026.01); *H10P 72/7618* (2026.01); *H10P 72/7621* (2026.01); *H10P 72/7624* (2026.01)

(58) Field of Classification Search
CPC .............. B25J 15/0028; H10P 72/7606; H10P 72/7608
See application file for complete search history.

(56) References Cited

U.S. PATENT DOCUMENTS

2012/0306139 A1 12/2012 Keigler et al.
2016/0004173 A1 1/2016 Kuiper et al.
2018/0141219 A1 5/2018 Bonora
2023/0133493 A1 5/2023 Bosboom
2023/0317503 A1 10/2023 Shimizu

OTHER PUBLICATIONS

Fala Technologies, "EFEM Products, Equipment Front End Module," https://www.falatech.com/page.asp?pageid=45, accessed Jan. 4, 2024, 3 pages.
International Search Report and Written Opinion, PCT No. PCT/US2025/010458, Mailed Apr. 29, 2025, Total pp. 12.

*Primary Examiner* — Jonathan Snelting
(74) *Attorney, Agent, or Firm* — Slater Matsil, LLP

(57) ABSTRACT

A wafer handling device includes multiple quartets of retention fingers, each having a resting flexure at a distal end that is vertically and torsionally compliant, a housing to which the retention fingers are mounted, a first pair of the retention fingers from a first quartet, the first pair configured to rotate to a first angular position to receive a wafer by the resting flexures, a second pair of the retention fingers from the first quartet configured to rotate to the first angular position after the first pair receives the wafer, and configured to vertically move towards the wafer in the first angular position, where the device grips the wafer at a second side by the second pair and at a first side by the first pair, and a bearing to which the housing is mounted for turning the housing to overturn the wafer 180 degrees.

20 Claims, 12 Drawing Sheets

300 COMPONENTS WITH A RETENTION FINGER ASSEMBLY

1400

1402
ROTATE A FIRST PAIR OF RETENTION FINGERS OF A FIRST QUARTET OF RETENTION FINGERS TO A FIRST ANGULAR POSITION, EACH RETENTION FINGER CONFIGURED TO ROTATE ABOUT AN AXIS AT A PROXIMAL END AND HAVING A RESTING FLEXURE AT A DISTAL END, EACH RESTING FLEXURE BEING VERTICALLY AND TORSIONALLY COMPLIANT, WHERE MULTIPLE QUARTETS OF RETENTION FINGERS INCLUDING THE FIRST QUARTET ARE MOUNTED IN A HOUSING TO WHICH EACH OF THE RETENTION FINGERS IS RESPECTIVELY MOUNTED AT THE AXIS

1404
ROTATE A SECOND PAIR OF RETENTION FINGERS OF THE FIRST QUARTET TO A SECOND ANGULAR POSITION, THE SECOND PAIR VERTICALLY SPACED A FIRST DISTANCE FROM THE FIRST PAIR

1406
RECEIVE A WAFER THROUGH A PASSAGEWAY EXTENDING CENTRALLY THROUGH THE HOUSING AND BEING OPEN AT A FIRST END AND A SECOND END OF THE HOUSING, BEING FREE OF THE PASSAGEWAY IN THE SECOND ANGULAR POSITION, THE WAFER BEING RECEIVED FROM THE FIRST END AND SUPPORTED AT A FIRST SIDE OF THE WAFER BY THE RESTING FLEXURES OF THE FIRST PAIR, THE SECOND PAIR VERTICALLY LOCATED TO FACE A SECOND SIDE OF THE WAFER OPPOSITE THE FIRST SIDE

1408
ROTATE THE SECOND PAIR TO THE FIRST ANGULAR POSITION

1410
VERTICALLY MOVE THE SECOND PAIR TOWARDS THE WAFER IN THE FIRST ANGULAR POSITION TO HOLD THE WAFER AT THE SECOND SIDE BY THE RESTING FLEXURES OF THE SECOND PAIR AND AT THE FIRST SIDE BY THE RESTING FLEXURES OF THE FIRST PAIR

1412
TURN, USING A BEARING TO WHICH THE HOUSING IS MOUNTED, THE HOUSING SUCH THAT THE WAFER IS FLIPPED 180 DEGREES WHEN THE WAFER IS HELD BY THE FIRST QUARTET.

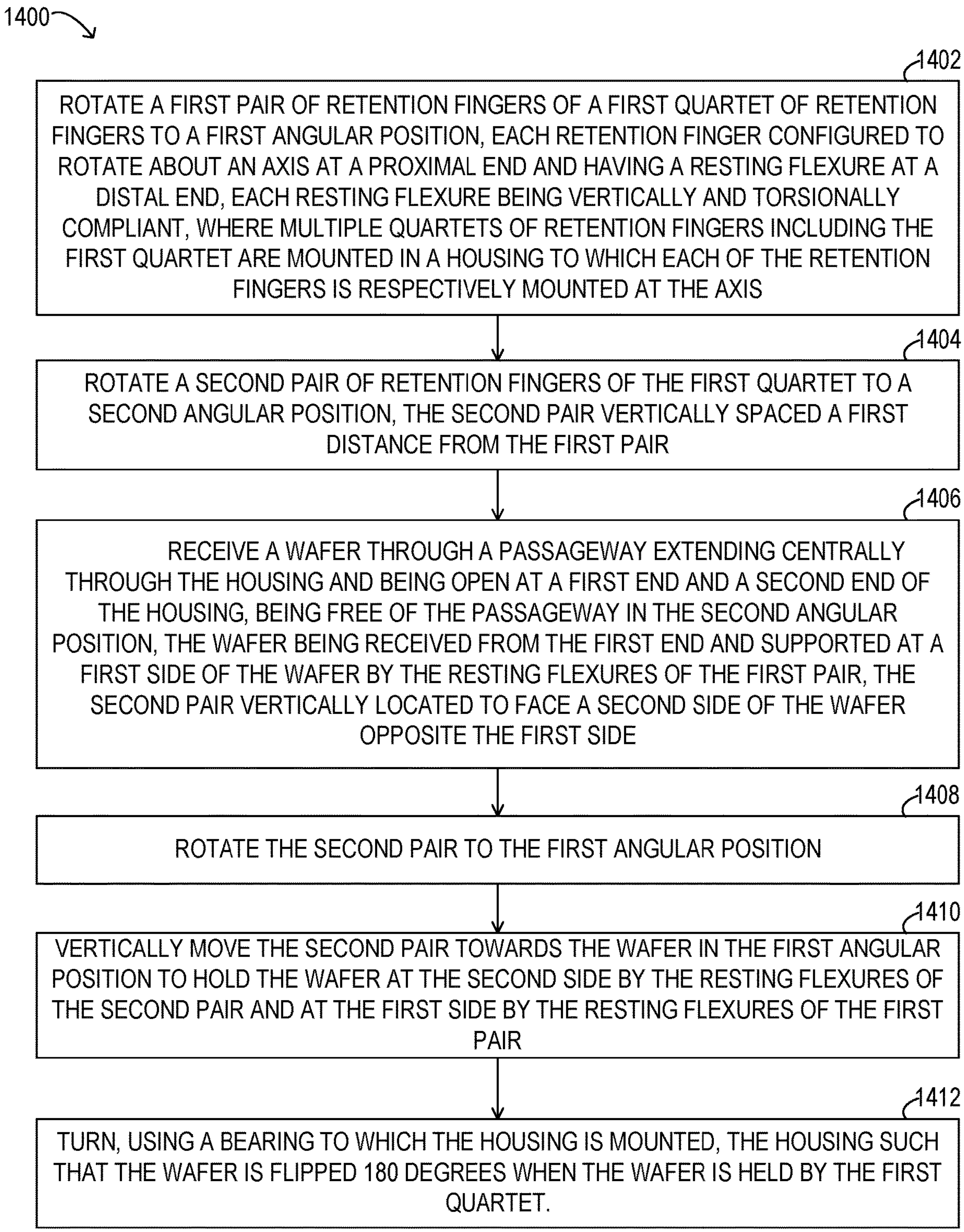

FIG. 14

MULTI-WAFER HANDLING SYSTEM

TECHNICAL FIELD

The present disclosure relates generally to semiconductor fabrication, and, in particular implementations, to a multi-wafer handling system.

BACKGROUND

Generally, in modern semiconductor manufacturing, material handling includes the handling of semiconductor substrates in the form of wafers along various steps in the fabrication process. In modern fabrication facilities, many material handling steps are automated using robotic equipment. The handling of wafers in semiconductor manufacturing predominately occurs using material handling robots that transfer individual wafers at different steps in the process. The semiconductor fabrication process typically involves different process modules (PM) to perform various tasks, such as lithography patterning, material deposition, and material removal, among others. Different types of process modules may perform one or more tasks or operations on a wafer. Accordingly, process modules may receive one or more wafers and internally handle the wafer for various operations internal to each process module.

In addition, a process module may be integrated into a larger process facility having multiple different process modules. Each wafer may undergo multiple processing steps at the different process modules, and may be subject to repeated sets of process steps such that the wafer can be introduced to a given process module multiple times before completion of fabrication. Many semiconductor fabrication facilities have automated carriers that can shuttle one or more wafers between process modules, thereby enabling batch processing of multiple wafers. For example, a wafer carrier holding multiple wafers can be delivered to a given process module where an equipment front end module (EFEM) receives the wafer carrier and transfers each wafer to the process module, typically through a bulkhead of the process module where a corresponding wafer buffer is installed. In many automated semiconductor fabrication facilities, a special EFEM robot is tasked with transferring wafers in this manner for loading into the process module, while internal robots within the process module receive the wafer at the wafer buffer through the bulkhead.

Furthermore, in some semiconductor fabrication steps, certain backside operations are performed on wafers that involve flipping the wafer over before further processing by a process module. For example, wafer-to-wafer (W2W) bonding may involve joining two opposite faces of two wafers together. Other types of hybrid integration, such as 3-dimensional (3D) bonding, may also involve flipping the wafer at certain steps, such as for backside grinding and metallization to form contact pads for bonding different parts together, among other steps. In typical semiconductor fabrication systems, wafer flipping is often performed on individual wafers, such as prior to introduction into a process module by an EFEM robot.

Accordingly, the typical method of flipping or overturning individual wafers can be slow and can add additional process time for wafer handling. Furthermore, an individual wafer flipping station at a process module can take up additional space and can involve additional functionality that is performed by an EFEM robot.

SUMMARY

In one aspect, a substrate handling device includes multiple quartets of retention fingers, each retention finger having a resting flexure at a distal end, a first pair of the retention fingers from a first quartet of the multiple quartets, the first pair configured to rotate to a first angular position to receive a wafer by the resting flexures of the first pair, and a second pair of the retention fingers from the first quartet, the second pair configured to rotate to a second angular position before the first pair receives the wafer, and to rotate to the first angular position after the first pair receives the wafer, the second pair further configured to vertically move towards the wafer in the first angular position. The substrate handling device can be configured to grip the wafer at a second side by the resting flexures of the second pair and at a first side by the resting flexures of the first pair; and a bearing to which the multiple quartets are mounted, the bearing for collectively turning the multiple quartets to flip the wafer by 180 degrees.

In another aspect, a method includes rotating a first pair of retention fingers of a first quartet of retention fingers to a first angular position, each retention finger configured to rotate about an axis at a proximal end and having a resting flexure at a distal end, where multiple quartets of retention fingers including the first quartet are mounted in a housing to which each of the retention fingers is respectively mounted at the axis. The method also includes rotating a second pair of retention fingers of the first quartet to a second angular position, the second pair vertically spaced a first distance from the wafer, and receiving a wafer through a passageway extending centrally through the housing and being open at a first end and a second end of the housing, the second pair being free of the passageway in the second angular position, the wafer being received from the first end and supported at a first side of the wafer by the resting flexures of the first pair, the second pair vertically located to face a second side of the wafer opposite the first side. The method still further includes, after the first pair receives and supports the wafer, rotating the second pair to the first angular position and vertically moving the second pair towards the wafer over the first distance in the first angular position to hold the wafer at the second side by the resting flexures of the second pair and at the first side by the resting flexures of the first pair; and turning, using a bearing to which the housing is mounted, the housing to overturn the wafer 180 degrees when the wafer is held by the first quartet.

In still a further aspect, a wafer handling device includes multiple quartets of retention fingers, each retention finger configured to rotate about an axis at a proximal end and having a resting flexure at a distal end, the resting flexure being vertically and torsionally compliant, and a housing to which each of the retention fingers is respectively coupled via the axis; a passageway extending centrally through the housing and being open at a first end and a second end of the housing, the retention fingers having access to the passageway. The wafer handling device also includes a first pair of the retention fingers from a first quartet of the multiple quartets, the first pair configured to rotate to a first angular position to receive, in the passageway by the resting flexures of the first pair, a wafer at a first side of the wafer, and a second pair of the retention fingers from the first quartet, the second pair configured to rotate to a second angular position free of the passageway before the first pair receives the wafer, and to rotate to the first angular position after the first pair receives the wafer, the second pair configured to vertically move towards the wafer in the first angular position, where the wafer handling device is configured to grip the wafer at a second side by the resting flexures of the second pair and at the first side by the resting flexures of the first pair. The wafer handling device further includes a bearing to which the housing is mounted, the bearing for turning the housing to overturn the wafer by 180 degrees when the wafer is gripped by the first quartet.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 14 is a method of flipping wafers using a retaining assembly, in an implementation.

DETAILED DESCRIPTION OF ILLUSTRATIVE IMPLEMENTATIONS

Figure 1A:
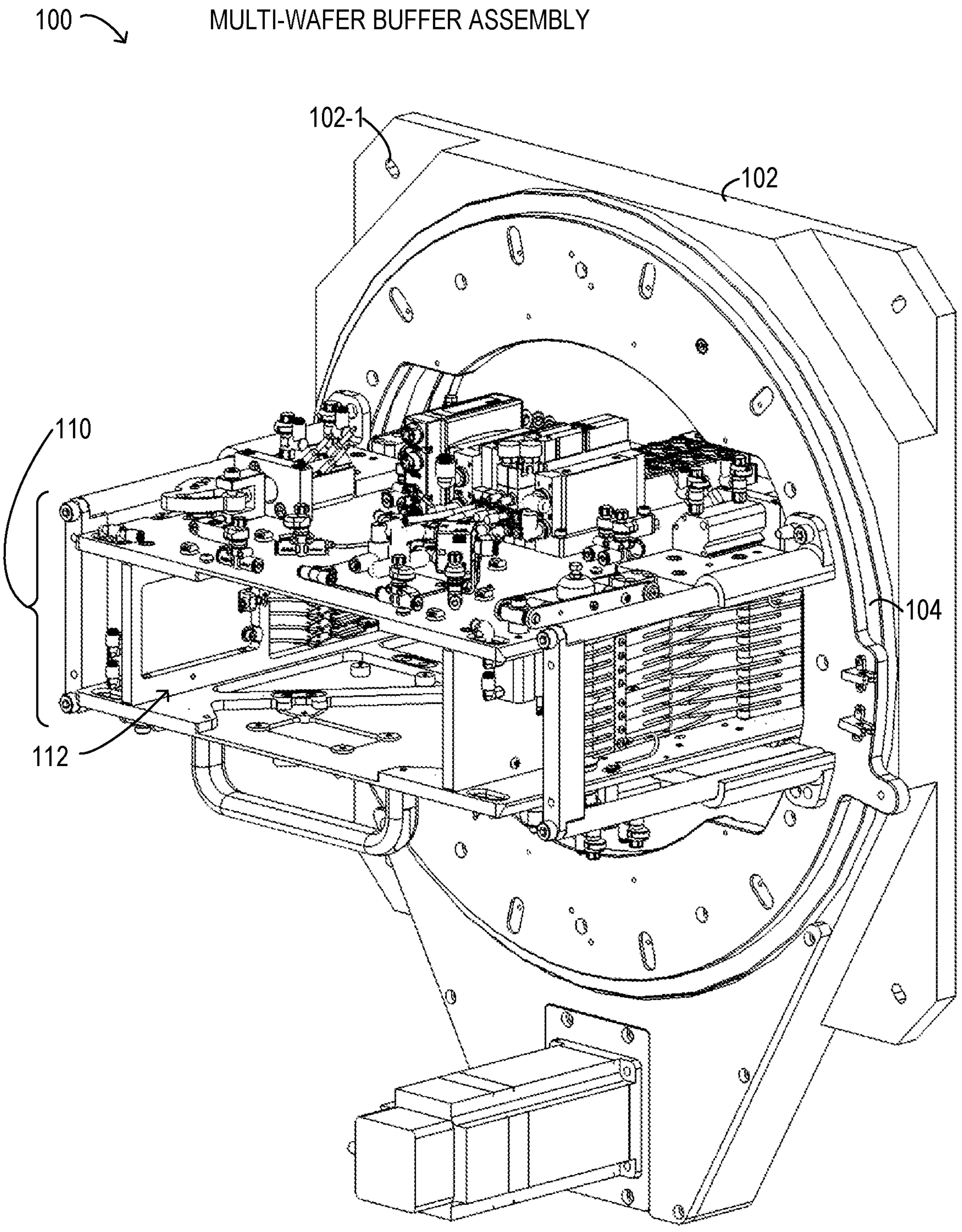
FIG. 1A is a depiction of a multi-wafer buffer assembly including a rotary stage, in an implementation.

This disclosure describes a multi-wafer handling system in various implementations.

In the following description, details are set forth by way of example to facilitate discussion of the disclosed subject matter. It should be apparent to a person of ordinary skill in the field, however, that the disclosed implementations are exemplary and not exhaustive of all possible implementations.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

As noted, the typical method of flipping or overturning individual wafers during semiconductor wafer handling can be slow and can add additional process time for wafer handling, which is not desirable. Typical mechanisms for flipping or overturning wafers can handle individual wafers and have been implemented as a standalone module or as an attachment to a wafer handling robot, such as an EFEM robot. Such individual wafer flipping stations can take up additional space and are associated with additional resources for floor installation and maintenance, which are undesirable aspects. An individual wafer flipping station can involve additional handling functionality that is performed by an EFEM robot, which can add complexity for integration of different systems that also incurs additional resources, which is not desirable. Furthermore, some automated wafer flipping systems use a suction grip, such as a suction cup, that can contaminate a semiconductor substrate with particles, particularly when the suction grip contacts the substrate at a center portion where integrated circuits (IC) on the wafer are located, which is undesirable.

The multi-wafer handling system described below in further detail can provide certain desirable improvements over typical wafer flipping mechanisms. Certain implementations can be integrated into a bulkhead of a process module, such as at an external wall of the process module that is externally accessible to an EFEM robot that loads wafers into the process module, while the external wall is also internally accessible to handling equipment within the process module. Certain implementations can receive and support multiple wafers and can enable pass-through access for picking and placing a wafer from either side of the multi-wafer handling system. Certain implementations can accordingly be independent of wafer handling equipment associated with a process module. Certain implementations can securely grip multiple wafers individually and flip the multiple wafers together in one operation. Certain implementations can grip wafers at an edge exclusion (EE) portion of a wafer, and so, avoid contacting an IC on the wafer, which also avoids contaminating an IC on the wafer. Certain implementations can grip wafers using a wafer resting flexure that is vertically and torsionally compliant, such that wafers having a bowed condition can be securely gripped and held by the wafer resting flexure. Certain implementations can include an edge grip flexure that contacts a wafer at an edge of the wafer, such as to laterally move the wafer into a desired position.

Turning now to the drawings, FIG. 1A is a depiction of a multi-wafer buffer assembly 100 (or simply, buffer assembly 100) including a rotary stage 102, in an implementation of the multi-wafer handling system. As shown, buffer assembly 100 further includes a multi-wafer retaining assembly 110 (or simply, retaining assembly 110) as will be described in further detail with respect to the subsequent figures. As shown, FIG. 1A is intended to be a schematic illustration that is not necessarily drawn to scale or perspective.

In buffer assembly 100 in FIG. 1A, rotary stage 102 is shown with attachment points 102-1, such as for mounting on a bulkhead of a process module in a semiconductor fabrication facility. It is noted that rotary stage 102 can be configured for compatibility with existing bulkheads and existing attachment points to a given process module, in various implementations, that can vary and can be different. Therefore, the arrangement and shape of rotary stage 102 is shown in an exemplary implementation for descriptive purposes. The bulkhead of the process module may contain a wall opening at an external wall of the process module through which wafers can be introduced into the process module. Rotary stage 102 can accordingly be mounted to the bulkhead at a location of the wall opening, such that the wall opening is aligned with a central passageway 112 (or simply, passageway 112) that is open at each opposing end of retaining assembly 110. In this arrangement of retaining assembly 110, wafers can be introduced, individually or collectively, at each end of central passageway 112 and can be removed, individually or collectively, at each end of central passageway 112. For example, an external EFEM robot can place individual wafers into central passageway 112, where the wafer is received by retaining assembly 110, as will be described in further detail, and can pick individual wafers from central passageway 112. Similarly, handling equipment within the process module at an opposite end of central passageway 112, such as another robot or another tool, can pick individual wafers from central passageway 112 and can place individual wafers into central passageway 112. Furthermore, the openings at each opposing end of central passageway 112 can be accessible for collective pick and place of multiple wafers simultaneously, in a similar manner, since retaining assembly 110 is configured to receive, grip, and retain multiple wafers such that the multiple wafers can be simultaneously flipped together in one operation. It is further noted that, due to the free openings at both ends of central passageway 112 that also do not obstruct pick and place wafer handling equipment on either side of retaining assembly 110, wafers can be simultaneously loaded into retaining assembly 110 at one end, while being removed from retaining assembly 110 at an opposite end, in various implementations. As will be shown and described with respect to the subsequent figures, the free openings at both ends of central passageway 112 remain free during operation of retaining assembly 110.

Also visible in buffer assembly 100 in FIG. 1A, is a main bearing 104 to which retaining assembly 110 is mounted to enable rotation of retaining assembly 110. Main bearing 104 can be part of rotary stage 102 that allows retaining assembly 110 to turn about a central axis, such that wafers loaded and secured within retaining assembly 110 can be collectively turned about the central axis, such as by an angular displacement of 180 degrees, which results in flipping the wafers over (e.g., overturning the wafers). It is noted that main bearing 104 can be configured to turn over any desired angular displacement relative to the central axis. In particular implementations, other components of the rotary actuator stage can be integrated into main bearing 104 or be cohoused with main bearing 104 or be mechanically coupled to main bearing 104. It is further noted that a size or a diameter of main bearing 104, along with a size of retaining assembly 110, can be variously dimensioned to handle wafers of different sizes, such as wafers having a diameter of 150 mm, 200 mm, 300 mm, or 450 mm, in different implementations. Furthermore, as will be depicted in the following figures, retaining assembly 110 is configured to handle eight (8) wafers in the implementations shown. However, in various other implementations, the multi-wafer retaining assembly described herein can be configured to handle different numbers of wafers, such as 2, 4, 6, 10, 12, 14, 16, 18, 20, 22, 24 wafers, or another number of wafers. Even though retaining assembly 110 is shown herein configured to handle up to eight (8) wafers, retaining assembly 110 can operate as described when populated with less than eight (8) wafers.

Figure 1B:
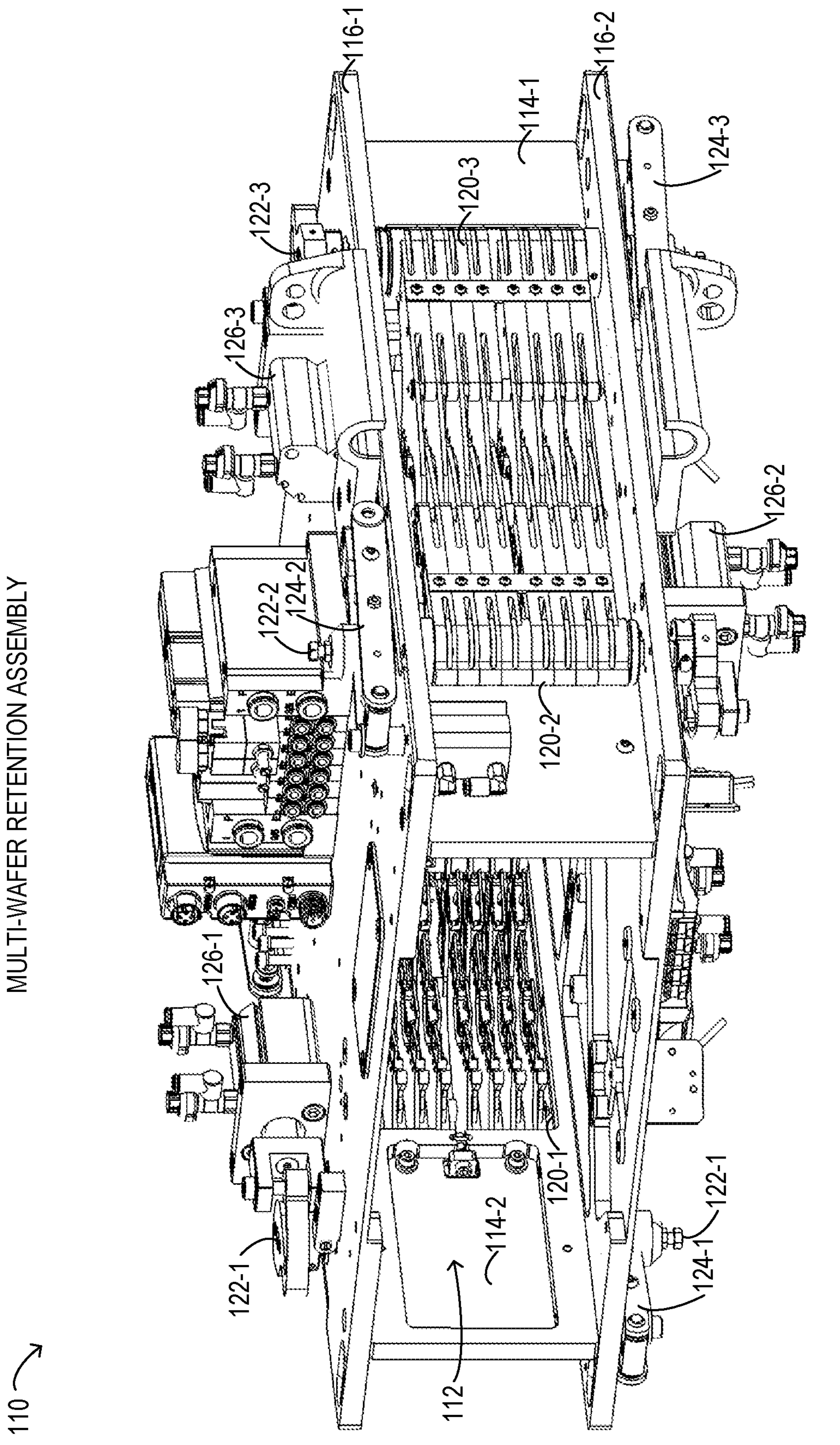
FIG. 1B is a depiction of a multi-wafer retaining assembly, in an implementation.

In FIG. 1B, multi-wafer retaining assembly 110 is shown in further detail in a dimetric view. As shown, FIG. 1B is intended to be a schematic illustration that is not necessarily drawn to scale or perspective.

In FIG. 1B, a base structure of retaining assembly 110 is shown comprising a first base plate 116-1 and a second base plate 116-2 to which a first sidewall 114-1 and a second sidewall 114-2 are attached, thereby forming central passageway 112. Sidewalls 114 have respective openings in which two retention finger assemblies 120 are mounted that comprise multiple retention fingers 402, discussed and shown in further detail below with respect to FIG. 4. Specifically, as shown, a first sidewall 114-1 has a second retention finger assembly 120-2 and a third retention finger assembly 120-3 mounted thereon, while a second sidewall 114-2 has a first retention finger assembly 120-1 and a fourth retention finger assembly obscured from view mounted thereon.

As shown in FIG. 1B, each retention finger assembly 120 is configured to rotate about an axis 122 and to translate vertically, such that the multiple retention fingers 402 attached to the retention finger assembly 120 rotate and translate vertically simultaneously in unison. Specifically, axis 122 is defined by a corresponding driveshaft that extends and protrudes through first base plate 116-1 and second base plate 116-2, and that can be rotated or vertically translated. In particular implementations, retention finger assembly 120 is configured to rotate between a first angular position and a second angular position. Specifically, at the first angular position, retention finger assembly 120 protrudes through sidewall 114 into passageway 112 in order to receive or grip a wafer; at the second angular position, retention finger assembly 120 is retracted behind sidewall and does not protrude into passageway 112. In FIG. 1B, all four retention finger assemblies 120 are depicted in the second angular position, or retracted from passageway 112. It is noted that retention finger assembly 120 can be configured to rotate to various desired angular positions, in different implementations. In addition to the angular displacement, retention finger assembly 120 is enabled to vertically translate or move, such as by a corresponding vertical translation of the driveshaft associated with axis 122. Again, in particular, retention finger assembly 120 can be configured to move vertically between a first vertical position and a second vertical position. The first vertical position corresponds vertically to contacting a wafer, such as for gripping the wafer, while the second vertical position corresponds to retracting from the wafer, such as for rotating to the second angular position, as will be explained in further detail.

As noted, each retention finger assembly 120 has eight (8) retention fingers 402 mounted thereon in an exemplary implementation shown in the figures. Each of the eight (8) retention fingers 402 is configured to respectively contact one wafer and is stacked in a vertically aligned configuration within retention finger assembly 120. Accordingly, one retention finger 402 from each of the four retention finger assemblies 120 (corresponding to a respective one of axis 122) collectively form a quartet of retention fingers 402 that contact one wafer, and respectively can provide a slot for the one wafer within passageway 112 when in the first angular position. In this manner, retaining assembly 110 is configured to receive, grip, and flip up to eight (8) individual wafers or other semiconductor substrates.

As shown in FIG. 1B, various mechatronic components are visible for performing the rotational translation and vertical translation of each of the four retention finger assemblies 120 using a respective driveshaft associated with axis 122. As noted, mechatronic components for one retention finger assembly 120 are shown together in the sectional view in FIG. 4. As shown in FIG. 1B, first retention finger assembly 120-1 is coupled to a first driveshaft at axis 122-1 and can be rotated using a first actuator 126-1. As shown, first actuator 126 is a linear pneumatic actuator with a pivot mechanism that rotates the driveshaft between the first angular position and the second angular position. Various other forms of actuation and angular displacement about axis 122 can be used in different implementations. As shown, linear actuator 126-1 is located at first base plate 116-1, while at an opposite end of the driveshaft at axis

122-1, a lift mechanism 124-1 is configured to perform the vertical translation of the driveshaft to vertically move first retention finger assembly 120-1, such as from the first vertical position to the second vertical position and back to the first vertical position. As shown, lift mechanism 124-1 can include another linear pneumatic actuator. It is noted that different types of actuators and lift mechanisms can be used in various implementations. Also shown in FIG. 1B is a second retention finger assembly 120-2, with a linear actuator 126-2 for rotation of second retention finger assembly 120-2 about axis 122-2, and with a lift mechanism 124-2 for vertical translation of second retention finger assembly 120-2. Also shown in FIG. 1B is a third retention finger assembly 120-3, with a linear actuator 126-3 for rotation of third retention finger assembly 120-3 about axis 122-3, and with a lift mechanism 124-3 for vertical translation of third retention finger assembly 120-3. A fourth retention finger assembly with a linear actuator for rotation and with a lift mechanism is at least partially obscured from view in FIG. 1B but is similarly configured for rotation and vertical translation.

Although retention finger assemblies 120 can be mounted in retaining assembly 110 in various orientations, it is noted that a particular orientation is shown in FIG. 1A. Furthermore, although each retention finger assembly 120 can be operated independently, such as with the described components for rotation and vertical translation, a particular operational synchronization can be used in certain implementations. Specifically, third retention finger assembly 120-3 and first retention finger assembly 120-1 are oriented to contact one or more wafers introduced into passageway 112 from a first side of each wafer, and are also configured to operate in unison with each other, such as for rotation and for vertical translation. Commensurately, second retention finger assembly 120-2 and the fourth retention finger assembly are oriented to contact the one or more wafers introduced into passageway 112 from a second side of each wafer, and are also configured to operate in unison with each other, such as for rotation and for vertical translation. In this manner, retaining assembly 110 can operate in a substantially similar manner regardless of rotational orientation of main bearing 104. In other words, when retaining assembly 110 turns 180 degrees to flip or to overturn the one or more wafers, retaining assembly 110 can operate in the same manner as when turned 0 degrees, as will be described in further detail.

Figure 2:
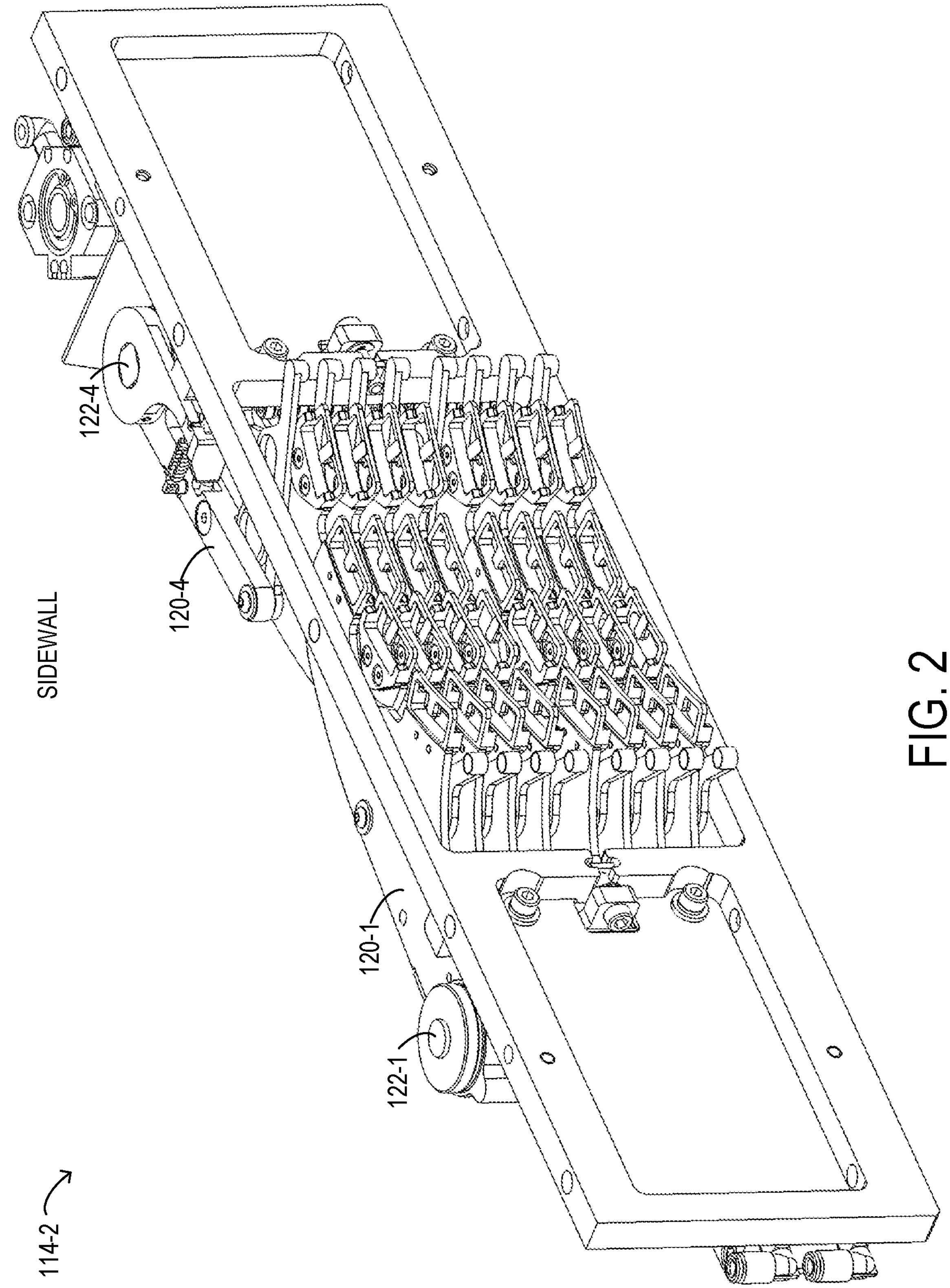
FIG. 2 is a depiction of a sidewall of a multi-wafer retaining assembly, in an implementation.

FIG. 2 is a depiction of sidewall 114-2 of multi-wafer retaining assembly 110, in an implementation. Specifically, FIG. 2 shows sidewall 114-2 as depicted in FIG. 1B in isolation, such that fourth axis 122-4 and fourth retention finger assembly 120-4 are visible, along with first axis 122-1 and first retention finger assembly 120-1. In FIG. 2, first retention finger assembly 120-1 and a fourth retention finger assembly 120-4 are shown rotated to the second angular position and protrude away from sidewall, such as into central passageway 112.

Figure 3:
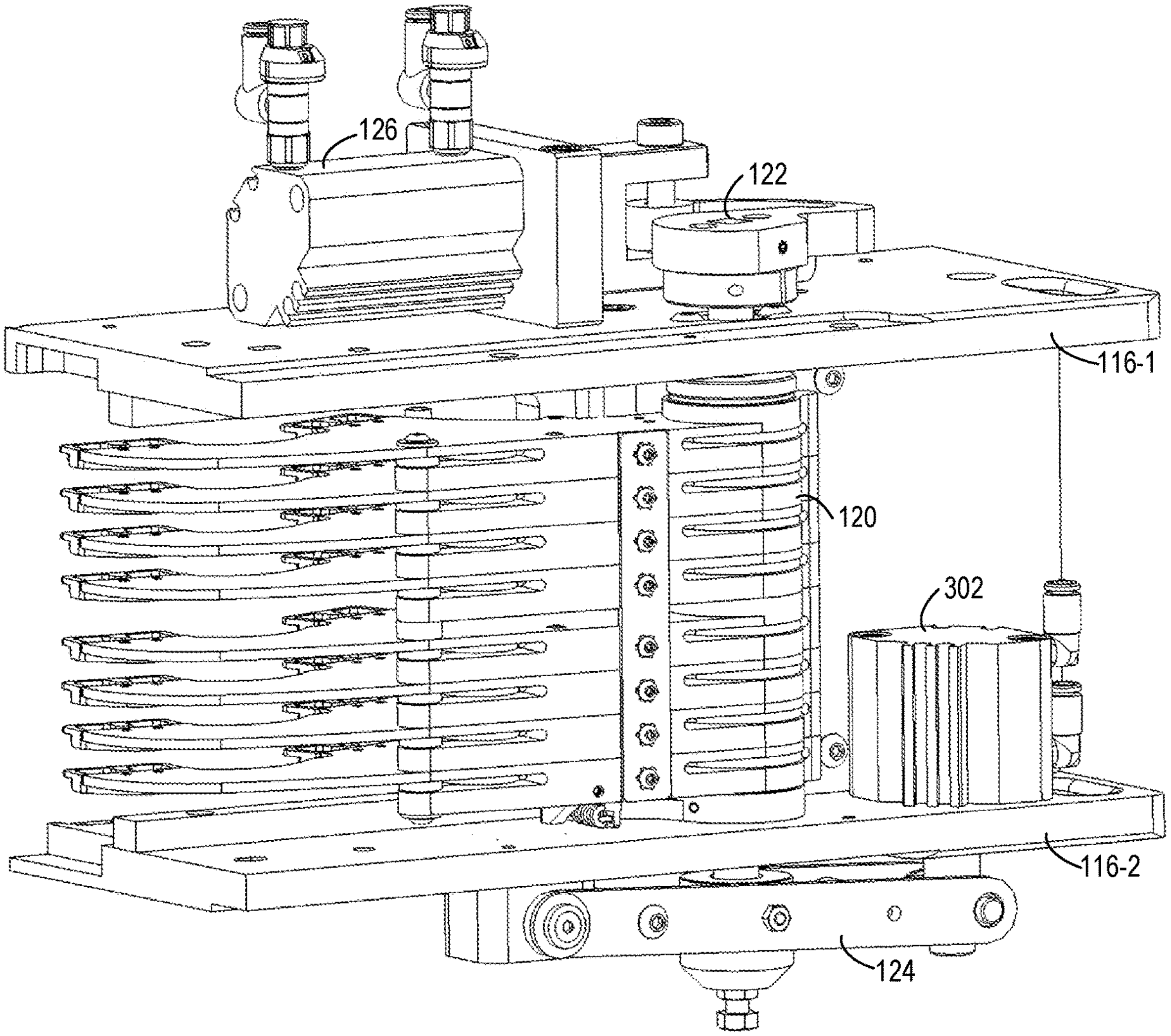
FIG. 3 is a depiction of components with a retention finger assembly, in an implementation.

FIG. 3 is a depiction of components 300 with retention finger assembly 120, in an implementation. FIG. 3 shows a sectional view of one retention finger assembly 120 that is mounted between first base plate 116-1 and second base plate 116-2, along with related components for rotational and vertical movement. It is noted that retention finger assembly 120 in FIG. 3 can represent any arbitrary one of four retention finger assemblies 120 included with retaining assembly 110. As shown in FIG. 3, retention finger assembly 120 is mounted about axis 122 on a driveshaft. First actuator 126 is shown with a pivot mechanism attached to first base plate 116-1 and configured to rotate retention finger assembly 120 about axis 122 from the first angular position to the second angular position. As shown in FIG. 3, retention finger assembly 120 is at the second angular position. Lift mechanism 124 is shown with a lift actuator 302 that is configured to vertically move retention finger assembly 120 from the first vertical position to the second vertical position.

Figure 4:
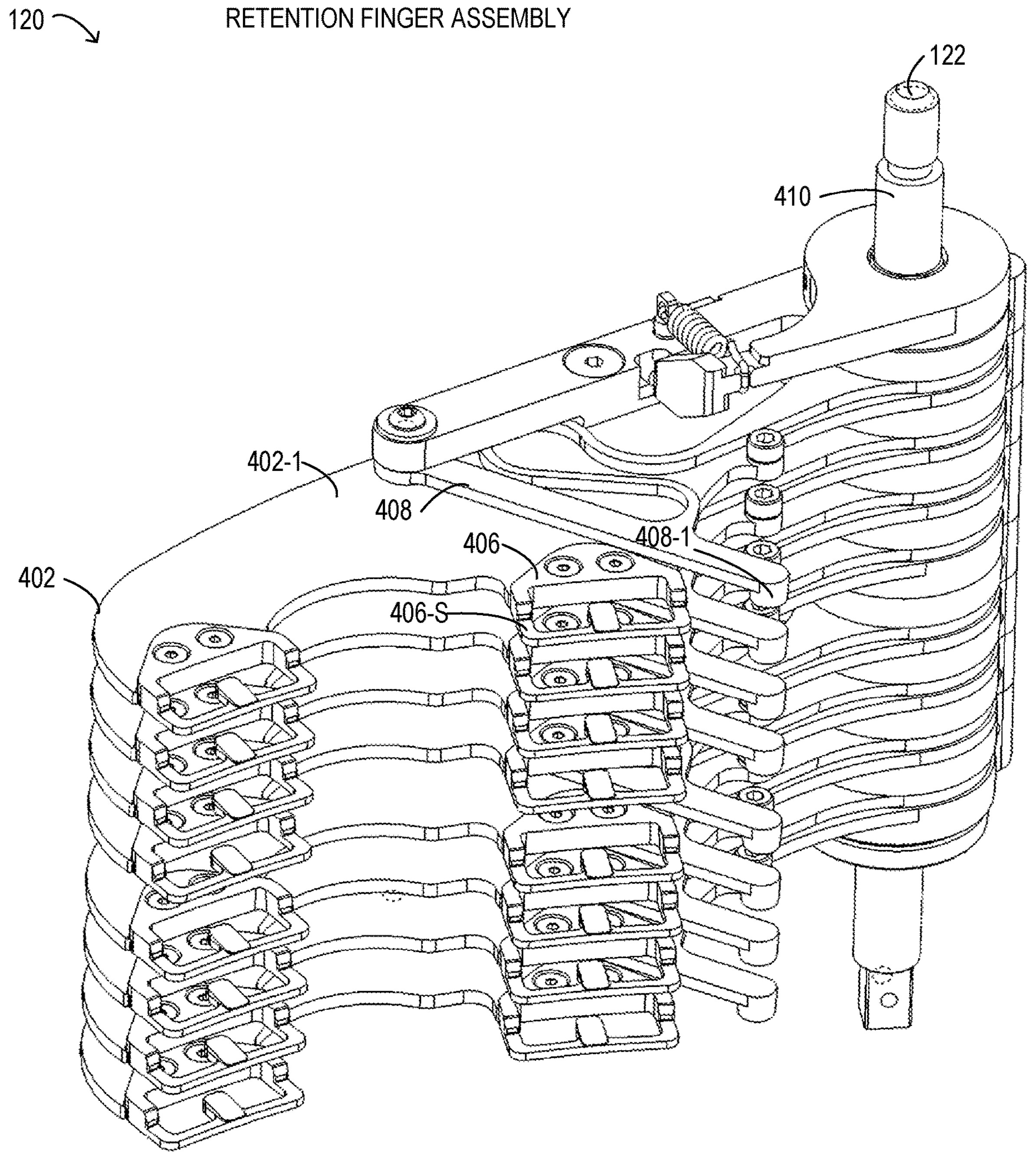
FIG. 4 is a depiction of a retention finger assembly, in an implementation.

FIG. 4 is a depiction of retention finger assembly 120, in an implementation. FIG. 4 shows further details of retention fingers 402, of which eight (8) are shown attached to a driveshaft 410 that defines axis 122. As noted, eight (8) retention fingers 402 are attached to driveshaft 410 rotate and move vertically in unison with driveshaft 410, and are accordingly fixed to driveshaft 410 in the same manner and orientation. The vertical alignment of the eight retention fingers 402 to each other, as well as a uniform vertical spacing between retention fingers 402, is also visible in FIG. 4. As shown, retention finger 402 has a finger body 402-1 in the form of a shaped plate that is penetrated by and affixed to driveshaft 410 at a proximal end of finger body 402-1. At a distal end of finger body 402-1, two wafer resting flexures 406 (or simply, resting flexures 406) are mounted (see also FIGS. 9, 10, and 12). Although two wafer resting flexures 406 are shown included with retention finger 402, it is noted that different numbers and configurations of resting flexures can be used in various implementations. Wafer resting flexure 406 is attached to finger body 402-1 in an orientation that corresponds to a diameter of a wafer that wafer resting flexure 406 can support and grip, such that wafer resting flexure 406 meets the wafer in a perpendicular orientation to the wafer edge. Specifically, wafer resting flexure 406 includes a stepped portion 406-S having a flat ledge and a vertical stop for engaging the wafer. In particular implementations, wafer resting flexure 406 is vertically and torsionally compliant in order to provide contact with wafer with a suitable frictional force, such as for gripping wafer during flipping by retaining assembly 110, including for gripping wafers having a bowed shape, such that the wafer is not planar. For example, vertical bowing with a vertical deviation of up to 1 mm can occur locally where wafer resting flexure 406 contacts the wafer. Accordingly, wafer resting flexure 406 can provide mechanical compliance by vertically and torsionally flexing (e.g., bending and twisting) to effectively grip the wafer. In various implementations, wafer resting flexure 406 can be made from a compliant material having good strength and also superior environmental stability. In particular implementations, the compliant material can be selected from one or more of a variety of polymers, such as acrylonitrile butadiene styrene (ABS), polyether ether ketone (PEEK), ethylene propylene diene monomer (EPDM) rubber, or another suitable polymer. In some implementations, wafer resting flexure 406, or a portion thereof, may be made using a composite structure with multiple different materials, such as a rigid metal interior portion with a polymer overmold, such as one or more polymers noted above, to provide a degree of vertical and torsional compliance. In some cases, the rigid metal interior portion can be equipped with resting pads that are fastened using one or more fasteners, such that the resting pads are made from a polymer to provide a degree of vertical and torsional compliance. The rigid metal interior portion can be made of a stainless steel or another suitable metal or metal alloy.

Also shown included with each retention finger 402 is an edge grip flexure 408 shown mounted with each finger body 402-1. Edge grip flexure 408 is also penetrated by and affixed to driveshaft 410 at a proximal end of edge grip flexure 408, in a similar manner as finger body 402-1. At a distal end, edge grip flexure 408 includes a protrusion or a boss 408-1 that has a vertical edge to engage an edge of the wafer, such as to nudge the wafer into a desired aligned position with respect to wafer resting flexure 406 (see also FIGS. 7, 8, and 11). It is noted that edge grip flexure 408 is fixed to driveshaft 410 and can move along with driveshaft 410 in the same manner as retention finger 402, in particular implementations. Furthermore, driveshaft 410 can have a mechanism to engage and disengage edge grip flexure 408 the wafer, such as when retention finger 402 is rotated to the second angular position (see FIGS. 7 and 8).

Figure 5:
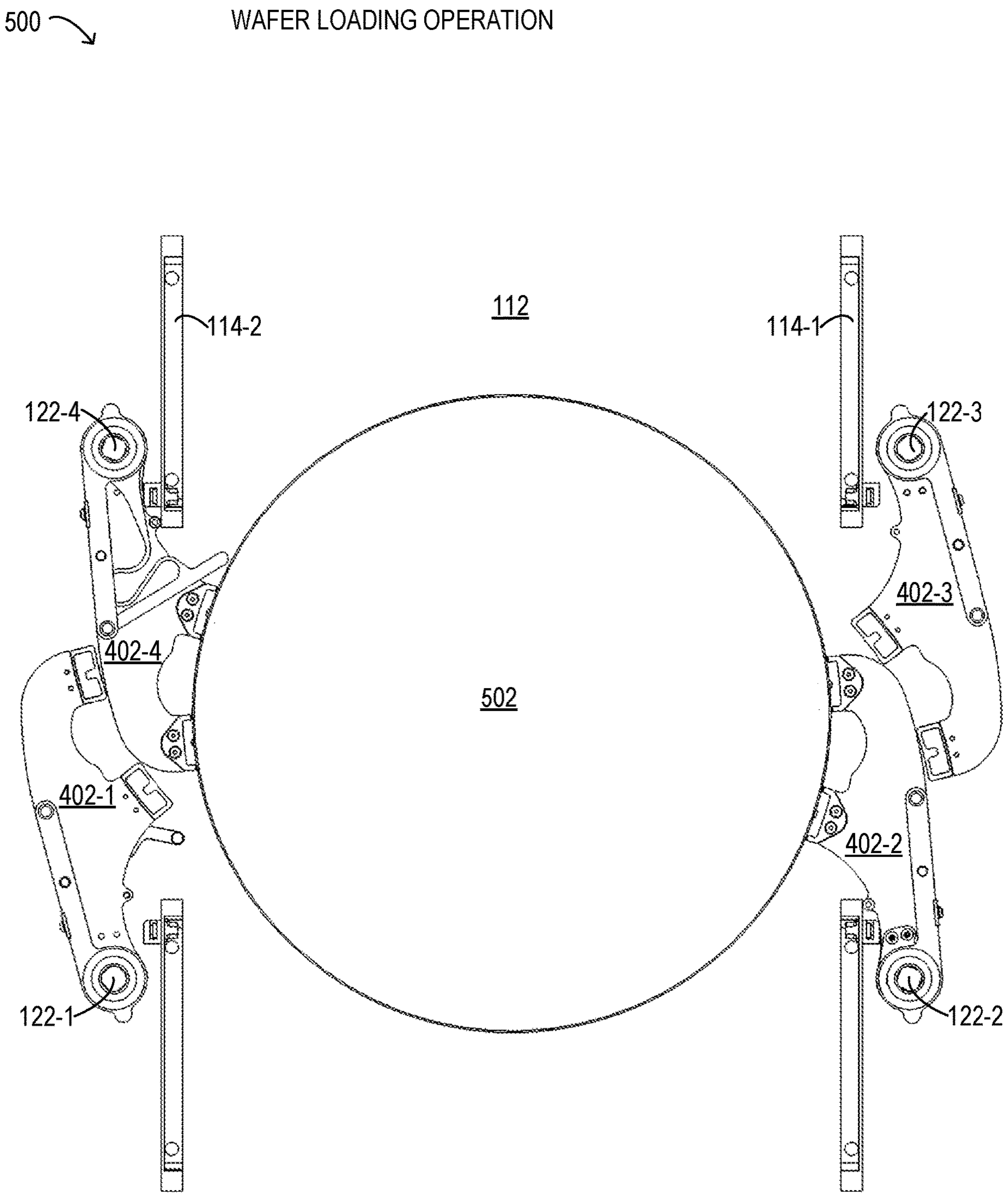
FIG. 5 is a depiction of a wafer loading operation, in an implementation.
Figure 6:
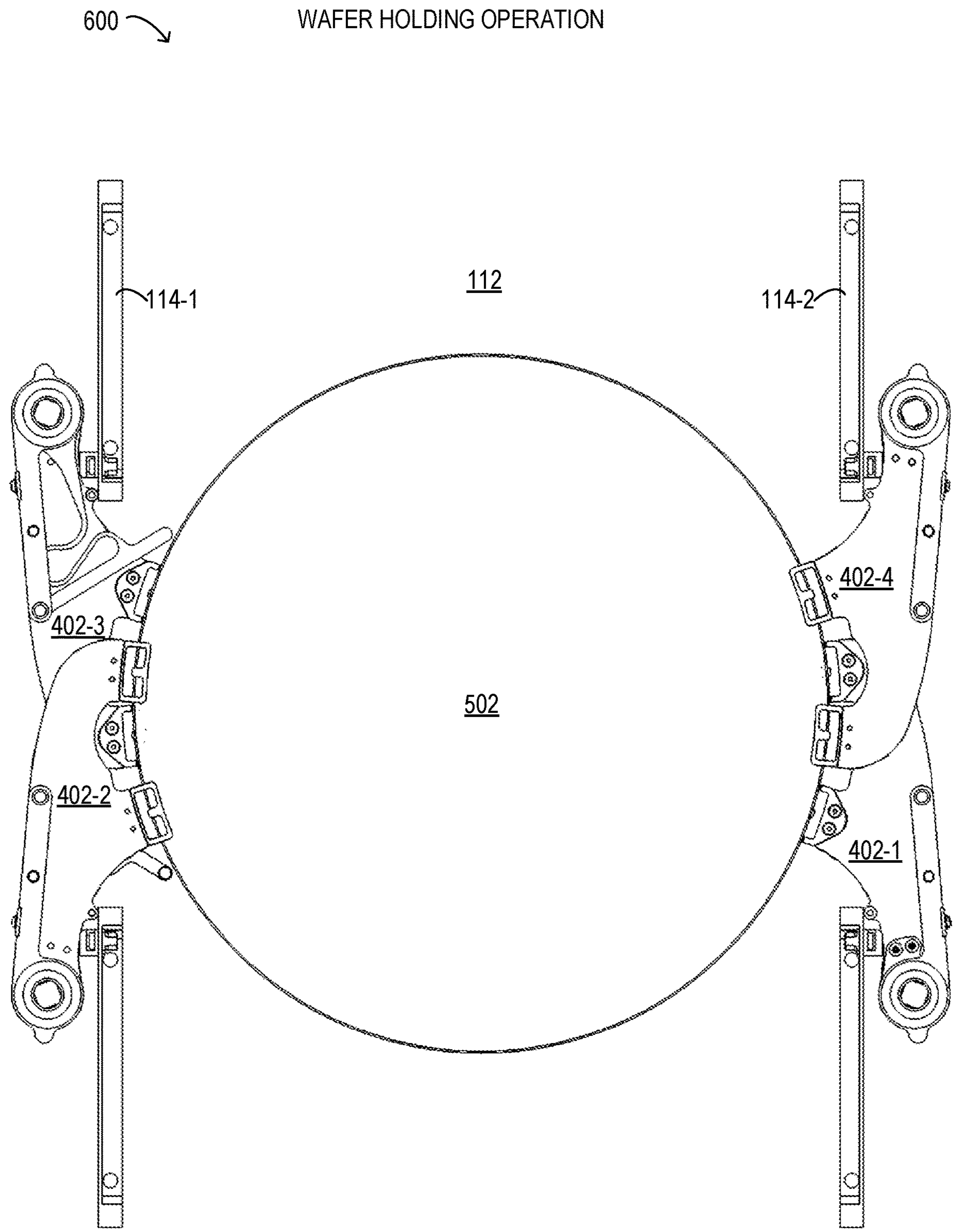
FIG. 6 is a depiction of a wafer holding operation, in an implementation.

Referring now to FIGS. 5 and 6, a depiction of a wafer loading operation 500 and a depiction of a wafer holding operation 600 are respectively shown, in an implementation. FIGS. 5 and 6 show a top view of one slot for a wafer 502 (or a substrate 502) in passageway 112 of retaining assembly 110, where wafer 502 is placed between first sidewall 114-1 and second sidewall 114-2. As noted, the slot for wafer 502 is provided by four retention fingers 402 forming a quartet of retention fingers, each respectively associated with an axis 122 corresponding to a driveshaft 410. Specifically, first retention finger 402-1 rotates and moves vertically with respect to first axis 122-1, second retention finger 402-2 rotates and moves vertically with respect to second axis 122-2, third retention finger 402-3 rotates and moves vertically with respect to third axis 122-3, and fourth retention finger 402-4 rotates and moves vertically with respect to fourth axis 122-4. Although each retention finger 402 can be configured to move independently, as noted above, first retention finger 402-1 moves simultaneously in unison with third retention finger 402-3, while second retention finger 402-2 moves simultaneously in unison with fourth retention finger 402-4, as shown. Furthermore, assuming a top view in FIG. 5, first retention finger 402-1 and third retention finger 402-3 are located above wafer 502, while second retention finger 402-2 and fourth retention finger 402-4 are located below wafer 502.

In wafer loading operation 500, prior to wafer 502 being introduced in passageway 112, second retention finger 402-2 and fourth retention finger 402-4 are rotated to the first angular position and are vertically moved to the first vertical position, while first retention finger 402-1 and third retention finger 402-3 are rotated to the second angular position and are vertically moved to the second vertical position. In this arrangement, when second retention finger 402-2 and fourth retention finger 402-4 are located below wafer 502, second retention finger 402-2 and fourth retention finger 402-4 form a tray that can receive wafer 502, such as placed on second retention finger 402-2 and fourth retention finger 402-4 from either side of passageway 112. At the same time, first retention finger 402-1 and third retention finger 402-3 are retracted from passageway 112 by rotation to the second angular position, and are elevated above wafer 502 in the second vertical position, thereby providing clearance for wafer 502 to be introduced into the specific slot or tray formed by second retention finger 402-2 and fourth retention finger 402-4. Wafer 502 can accordingly rest in this configuration on four wafer resting flexures 406 (two each on second retention finger 402-2 and fourth retention finger 402-4). Then, wafer 502 can be placed in the tray or slot formed by second retention finger 402-2 and fourth retention finger 402-4, such as by a wafer handling robot, which can release the wafer and retract itself. It is noted that while a single quartet of retention fingers 402 forming one wafer tray or slot is shown in FIG. 5, in operation of retaining assembly 110, multiple wafers can be simultaneously be received by respective multiple (e.g., eight (8) as shown in FIG. 1B) quartets of retention fingers 402 that operate simultaneously in unison, as explained previously.

Then, in wafer loading operation 500, first retention finger 402-1 and third retention finger 402-3 can be rotated into the first angular position and then moved (e.g., lowered) to the first vertical position, such that wafer 502 is clamped and gripped by the four (4) retention fingers 402, such as by the eight (8) wafer resting flexures 406. The resulting configuration is shown in wafer holding operation 600 in FIG. 6, in which wafer 502 is held and secured in retaining assembly 110. In some implementations, in wafer loading operation 500, one or more edge grip flexures 408 can be activated to nudge wafer 502 to a desired aligned location in passageway 112, such as aligned to wafer resting flexures 406 (see FIGS. 7 and 8). In some implementations, the wafer alignment using edge grip flexures 408 can be done after wafer 502 has been gripped from both sides by the eight (8) wafer resting flexures 406, prior to retaining assembly 110 turning 180 degrees to flip wafer 502 (and other wafers loaded in retaining assembly 110) over.

In wafer holding operation 600 shown in FIG. 6, retaining assembly has been turned 180 degrees to flip wafer 502, which results in the same configuration, but in which the specific pairs of retention fingers are reversed, as noted by the labeling of retention fingers 402 and sidewalls 114, which have been reversed from wafer loading operation 500. Then, the same procedure for wafer loading operation 500 is performed in reverse to enable wafer 502 to be picked by a wafer handling robot, from either side of passageway 112, and removed from retaining assembly 110.

Figure 7:
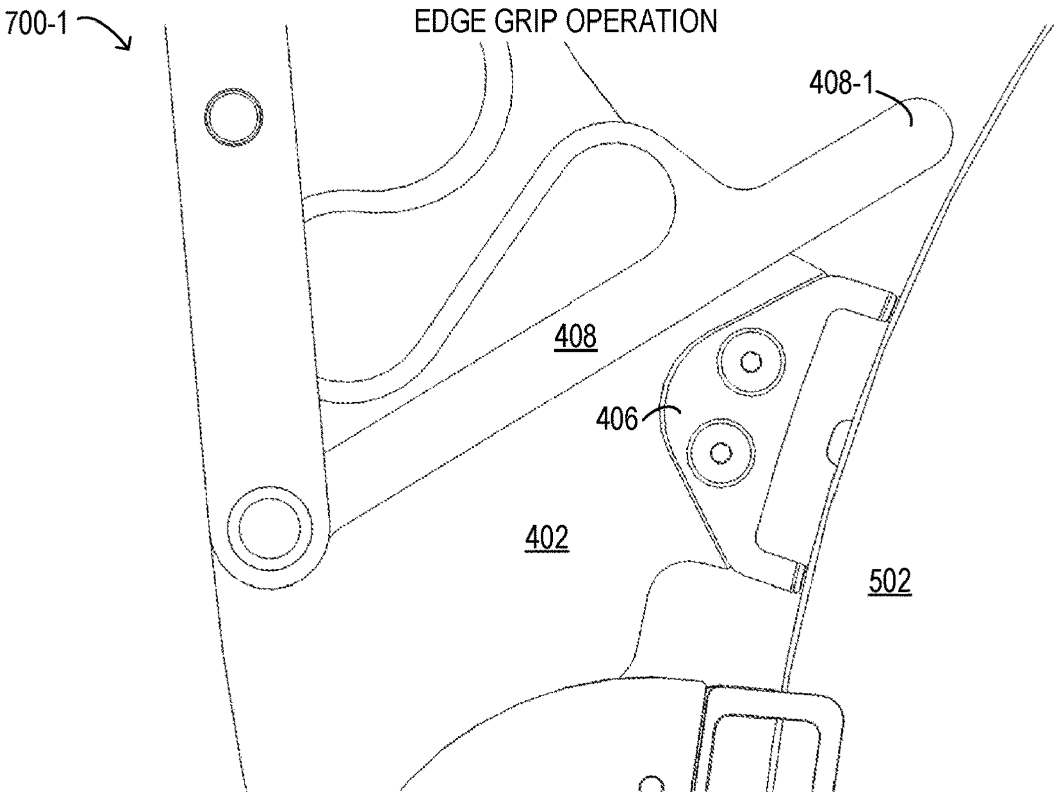
FIGS. 7 and 8 are depictions of an edge grip operation, in an implementation.
Figure 8:
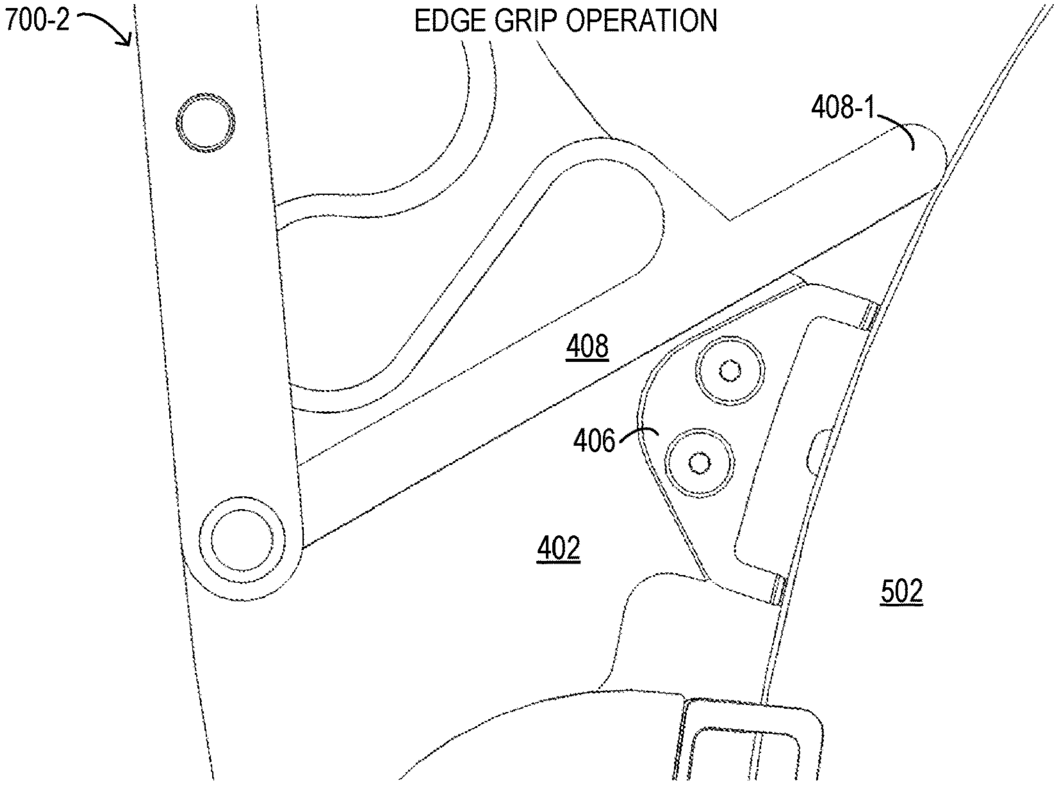

FIGS. 7 and 8 are depictions of an edge grip operation 700-1 and 700-2, respectively, in an implementation. In FIGS. 7 and 8, edge grip operation 700 shows a top view in the same orientation as wafer holding operation 600 in FIG. 6 but in a close-up view for improved clarity to show operation of edge grip flexure 408. In edge grip operation 700, wafer 502 is secured by a quartet of retention fingers 402, and thus, is gripped by eight (8) wafer resting flexures 406, four (4) on a first side of wafer 502, and four (4) on a second side of wafer 502. In this state, wafer 502 is ready for flipping over but may not be precisely aligned within the grip of the eight (8) wafer resting flexures 406.

In edge grip operation 700-1 in FIG. 7, edge grip flexure 408 is visible with boss 408-1 at a distal portion that is configured to engage with wafer 502 for alignment purposes. Specifically, in edge grip operation 700-1, boss 408-1 is shown in a retracted position to provide greater clearance for wafer 502 to be introduced into passageway 112, even when two (2) of retention fingers 402 are in the first angular position in order to support wafer 502 from below. In various implementations, the clearance between boss 408-1 and an edge of wafer 502 can be less than 5 mm, for example, about 4 mm in particular implementations. After the remaining two (2) retention fingers 402 in the quartet of retention fingers 402 defining the slot for wafer 502 in retaining assembly 110 are turned to the first angular position and lowered to the first vertical position to secure wafer 502, boss 408-1 can be extended to engage the edge of wafer 502, as shown in edge grip operation 700-2 in FIG. 8. In edge grip operation 700-2, boss 408-1 is extended to engage the edge of wafer 502 and may be configured to have an interference of less than 1 mm with wafer 502, such as about 0.5 mm in particular implementations. It is noted that edge grip flexure can accordingly be made from a suitably compliant material that nonetheless has sufficient strength or stiffness to nudge wafer 502 into a desired position. It is noted that, since each retention finger 402 can be equipped with edge grip flexure 408, in the clamped or closed condition of wafer 502 shown in FIGS. 7 and 8, there can be up to four (4) edge grip flexures 408 that act to nudge wafer 502, as shown in edge grip operation 700. In particular implementations, the up to four (4) edge grip flexures 408 can be configured to nudge wafer 502 substantially simultaneously to achieve a desired centering effect on wafer 502.

Figure 9:
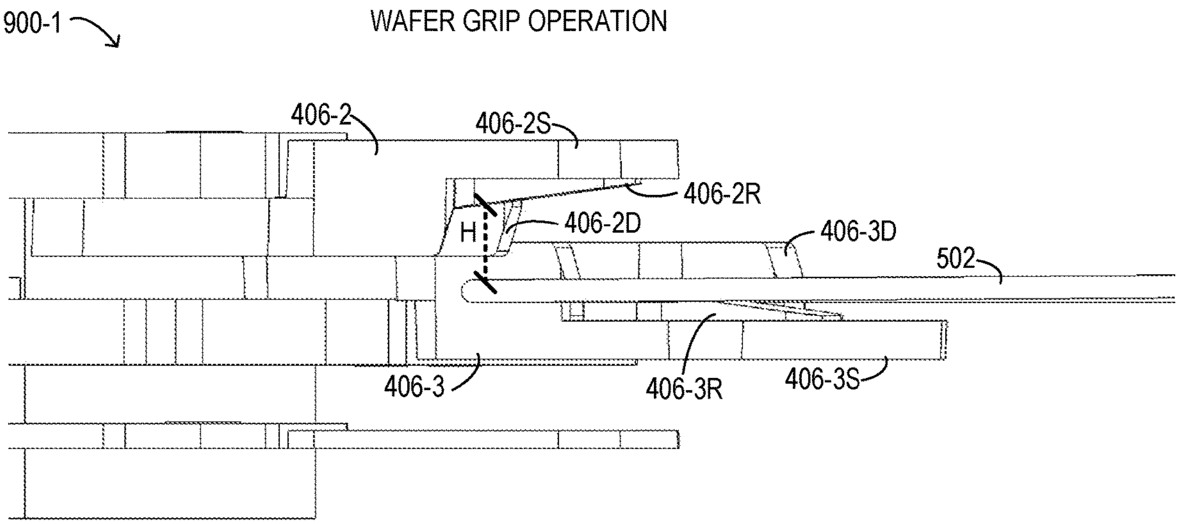
FIGS. 9 and 10 are depictions of a wafer grip operation, in an implementation.
Figure 10:
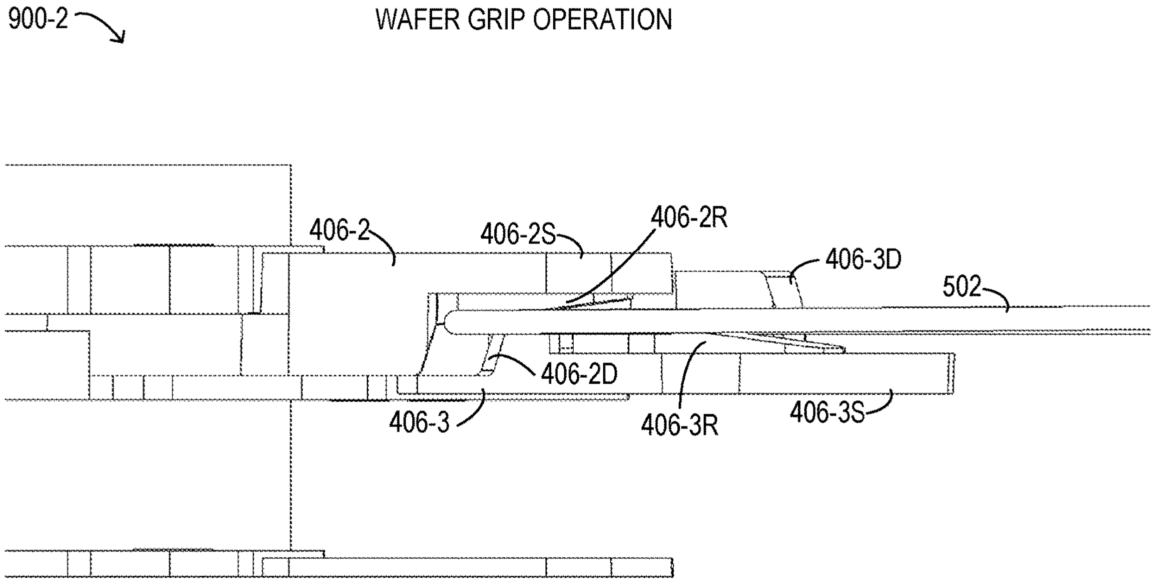

FIGS. 9 and 10 are depictions of a wafer grip operation 900-1 and 900-2, respectively, in an implementation. In FIGS. 9 and 10, wafer grip operation 900 shows a lateral view in close up corresponding to the arrangement of retention fingers 402 in wafer holding operation 600 in FIG. 6. In FIGS. 9 and 10, a pair of wafer resting flexures 408-2 and 408-3 are thus shown but it will be understood that wafer grip operation 900 is representative for any pair of wafer resting flexures 406. In wafer grip operation 900, wafer resting flexure 406-3 is located below wafer 502, while wafer resting flexure 406-2 is above wafer 502. In wafer grip operation 900 in FIGS. 9 and 10, both wafer resting flexures 408-3 and 408-2 are located in the first angular position, while wafer resting flexure 406-3 is in the first vertical position and supports wafer 502. In wafer grip operation 900-1 in FIG. 9, wafer resting flexure 406-2 is in the second vertical position, while in wafer grip operation 900-2 in FIG. 10, wafer resting flexure 406-2 has been lowered to the first vertical position to engage wafer 502.

Figure 12:
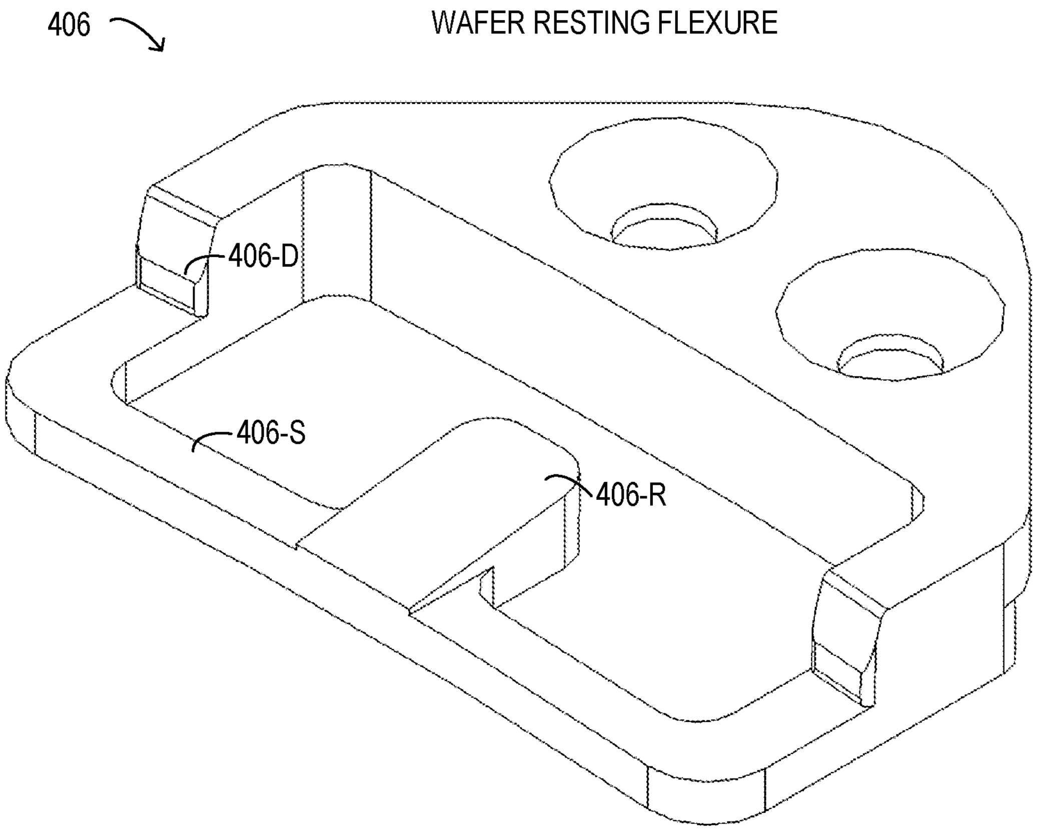
FIG. 12 is a depiction of a wafer resting flexure, in an implementation.

In FIGS. 9 and 10, further details of wafer resting flexure 406 are visible in operation (see also FIG. 12). Specifically, using wafer resting flexure 406-2 as an example, a shelf (or tray) portion at a distal end of resting flexure 406-2 is visible and labeled as 406-2S. Shelf portion 406-2S has a reduced vertical height as compared with a proximal body portion of resting flexure 406-2 to form the shelf (or tray) to engage wafer 502, whether from the bottom or from the top of wafer 502. Shelf portion 406-2S also includes other features, such as a ramp rest 406-2R that is angled in a horizontal slope. Ramp rest 406-2R contacts wafer 502 from a top or bottom surface of wafer 502 and serves to reduce the contact area with wafer 502, as well as to place the contact area with wafer 502 at an edge portion of wafer 502, so as to remain in the EE zone of wafer 502 with greater likelihood. Shelf portion 406-2S also includes one or more detention stops 406-2D that are vertically angled and have a vertical stop portion at a surface of shelf portion 406-2S (see also FIG. 12). Wafer resting flexure 406-3 has corresponding shelf portion 406-3S, ramp rest 406-3R, and detention stop 406-3D.

In wafer grip operation 900-1 in FIG. 9, as wafer 502 is placed on shelf portion 406-3S, such as when wafer 502 is introduced into passageway 112 of retaining assembly 110 in a horizontal direction, wafer 502 may engage vertical ramp portions or vertical stop portions of detention stops 406-3D that can provide a detention stop. Then, as wafer 502 is lowered into resting flexure 406-3 shelf portion 406-3S, such as by an external robot tool, the vertical ramp portions can guide the wafer to the vertical stop portions of detention stops 406-3D as wafer 502 is released and rests on shelf portion 406-3S, and specifically on ramp rest 406-3R. At this time, resting flexure 406-2 is still at the second vertical position where a surface of ramp rest 406-2R has a standoff gap (H) of less than about 5 mm from a top surface of wafer 502, as shown. In particular implementations, the standoff gap can be less than about 4 mm or less than about 3 mm from the top surface of wafer 502. Then, as resting flexure 406-2 is lowered onto wafer 502, as shown in wafer grip operation 900-2 such that the standoff gap H is reduced to zero, in a gripped or clamped state. As shown in wafer grip operation 900-2, ramp portion 406-2R may engage with wafer 502 such that ramp portion 406-2R and ramp portion 406-3R have an interference with wafer 502 of less than 100 μm, such as about 75 μm in some implementations. This interference results in a bidirectional vertical clamping force on wafer 502 that secures wafer 502, while detention stops 406-2D and 406-3D serve to laterally align wafer 502. After wafer grip operation 900-2, edge grip operation 700 may be performed to nudge wafer 502 into a final position, as described above with respect to FIGS. 7 and 8.

It is noted that in FIGS. 9 and 10, wafer 502 is shown as being substantially planar, such as being near perfectly flat. However, it is observed that in certain implementations, such as where multiple layers of different types of semiconductor materials (e.g., conductors, dielectrics, semiconductors) are formed on IC devices on wafer 502, wafer 502 may exhibit a certain degree of bowing that may be localized at wafer resting flexures 406. For example, localized variations in wafer height at wafer resting flexures 406 of up to 1,000 μm may be observed. In such cases, wafer resting flexures 406 are configured and fabricated to be compliant, as noted, and can be made with a sufficiently compliant material to sufficiently grip wafer 502 even when locally bowed, such as for safe handling and safe flipping by retaining assembly 110. Specifically, wafer resting flexures 406 can be designed to deflect under the weight of a standard silicon wafer, such as a 300 mm diameter silicon wafer having a thickness of less than about 1,000 μm, such as 775 μm in particular implementations.

Figure 11:
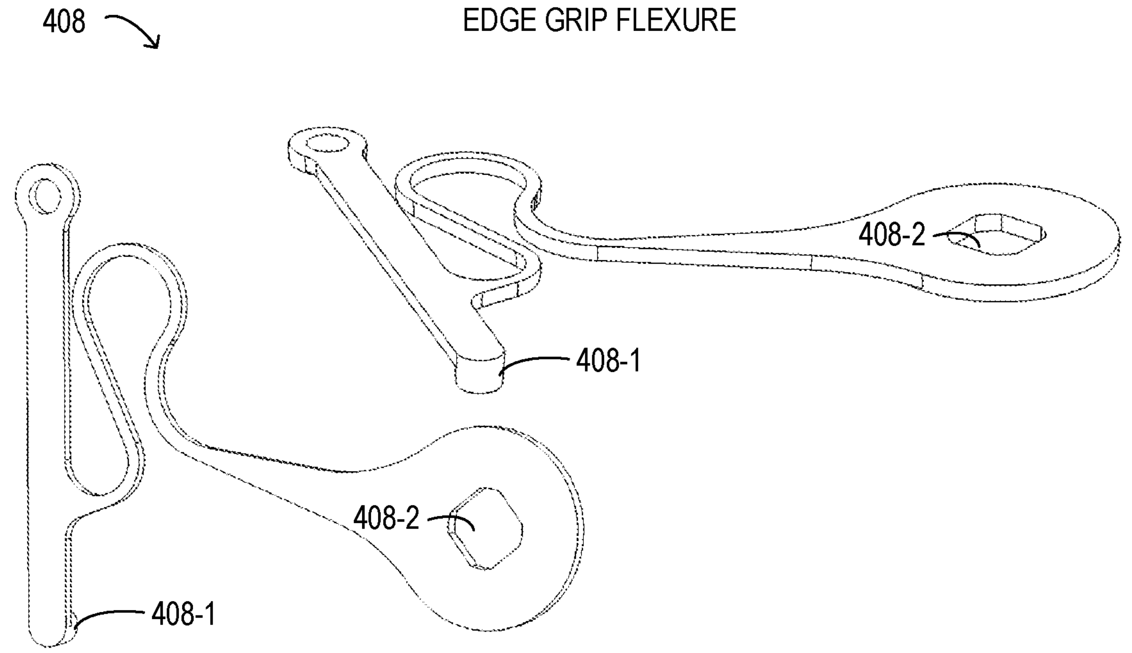
FIG. 11 shows depictions of an edge grip flexure, in an implementation.

FIG. 11 shows depictions of edge grip flexure 408, in an implementation. In FIG. 11, two views of edge grip flexure 408 are shown from different perspectives. Also visible in FIG. 11 is boss 408-1 at a distal portion of edge grip flexure 408 that can be used to nudge and edge of wafer 502. At a proximal portion of edge grip flexure 408 an opening 408-2 that is penetrated by driveshaft 410 defining axis 122 is also visible, as explained above with respect to FIGS. 7 and 8.

FIG. 12 is a depiction of wafer resting flexure 406, in an implementation. In FIG. 12, details of shelf portion 406-S, including ramp portion 406-R and detention stop 406-D are more clearly visible, including the vertical ramp portion and vertical stop portion of detention stop 406-D, as explained above with respect to FIGS. 9 and 10.

In the previous description, mechanical engagement with wafer 502 by various components of retaining assembly 110 are explained in detail. It is noted that additional instrumentation can be used to sense engagement with or a position of wafer 502. For example, certain sensors may be used at locations where wafer 502 contacts wafer resting flexure 406 and/or edge grip flexure 408, in some implementations, such as strain gages, piezoelectric sensors, optical sensors, among others. The signals from such sensors can be used to provide feedback to a control system of retaining assembly 110 that controls operation of the four (4) driveshafts 410, for example. The control system may be so enabled to detect a certain state of individual wafers 502, such as handled by an individual quartet of retention fingers 402 that form a slot or a tray to receive, grip, rotate, and release wafer 502. The control system may include a processor having access to memory media storing instructions executable by the processor. The processor and/or instructions can be configured to receive the signals from the instrumentation that interfaces with the one or more sensors.

Figure 13:
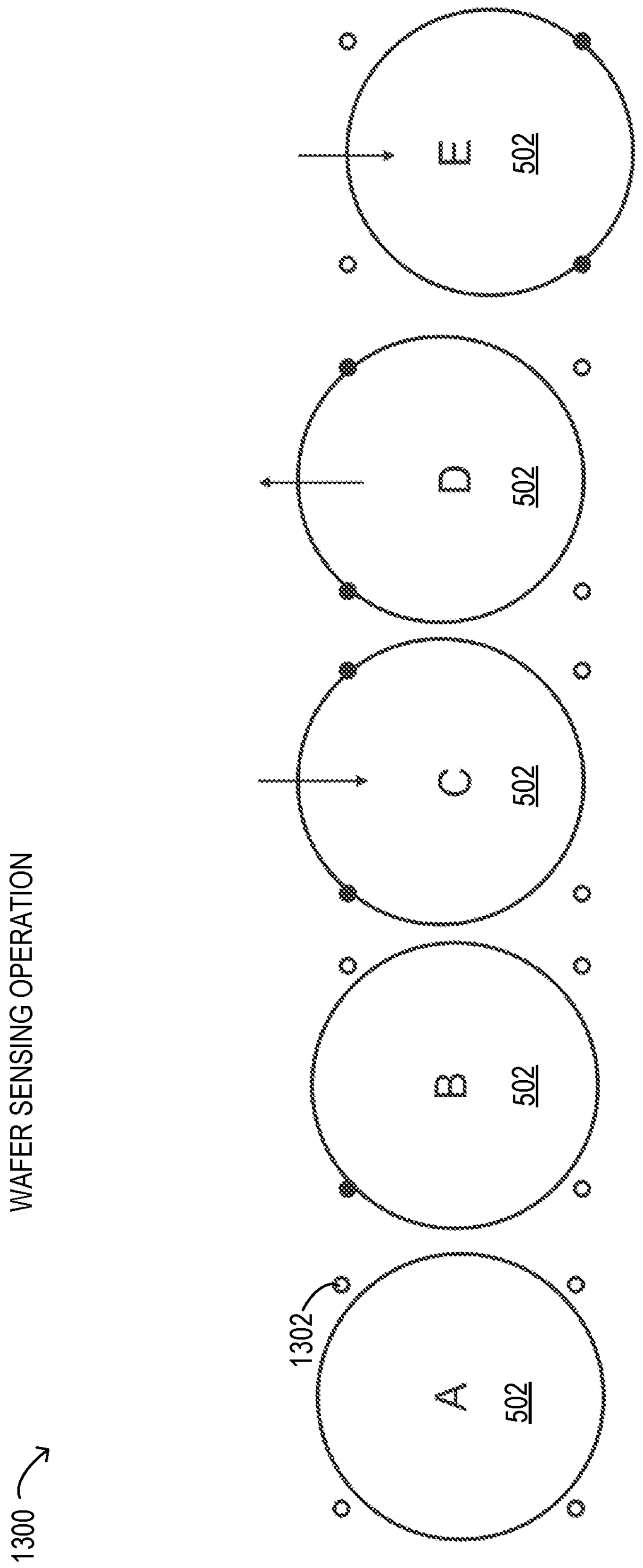
FIG. 13 is a depiction of a wafer sensing operation, in an implementation.

FIG. 13 is a depiction of a wafer sensing operation 1300, in an implementation. As shown and described below, wafer sensing operation 1300 may be performed to detect whether retaining assembly 110 is empty or is loaded with one or more wafers 502. Furthermore, wafer sensing operation 1300, as shown and described below, can be performed to detect whether any loaded wafer is out of position, such as to confirm or monitor a place operation or a pick operation performed by an external robot.

In FIG. 13, depictions of five (5) wafers 502 indicating five (5) respective sensing conditions are shown as A, B, C, D, E. Each sensing condition can be based on a signal from four (4) of five (sensors) used with retaining assembly 110, respectively shown by an indicator 1302 that is shown as an empty circle in a normal state and as a solid circle in an error state. The signal shown by indicator 1302 in wafer sensing operation 1300 can be received from four (4) respective optical sensors that are mounted at first base plate 116-1 and second base plate 116-2, for example, at the locations relative to wafer 502 as shown in FIG. 13. Specifically, the optical sensors can be line-of-sight sensors, such as with an emitter and a detector, at four corners external to wafer 502 as shown in FIG. 13. For example, the optical sensors can include laser emitters and photodiode detectors that indicate the normal state when light from a laser emitters reaches a corresponding photodiode detector, and indicate the error state when no light from the laser emitter reaches the corresponding photodiode detector. Because the line-of-sight is vertically arranged to pass by any and all wafers 502 that may be loaded into retaining assembly 110, the optical sensors can provide collective information about the positional state of wafers 502 loaded into retaining assembly 110, even when the sensors are not configured to provide specific information about any individual wafer 502, such as with a distance measurement. Thus even absent any distance measurement to identify any individual wafer, the collective sensor arrangement can identify the sensing conditions A, B, C, D, E depicted in wafer sensing operation 1300. A further fifth sensor can be centrally located at wafers 502 that can provide a fifth signal indicating whether retaining assembly 110 is empty of wafers 502 or not, (e.g., can indicate whether at least one wafer 502 is loaded into retaining assembly 110). In wafer sensing operation 1300 shown in FIG. 13, it can be assumed that the fifth sensor indicates a non-empty condition and is not further considered in the description below.

As shown in wafer sensing operation 1300 in FIG. 13, a sensing condition A can indicate a normal placement of all wafers 502 currently loaded into retaining assembly 110, such that retaining assembly 110 is ready for flipping 180 degrees, as described previously. A sensing condition B can indicate a potential failure of at least one resting flexure 406, and a location of indicator 1302 can identify which one or more retention fingers 402 is/are the source of the failure that typically occurs during the flipping operation, such as a result of wafer slide out of a single wafer 502. A sensing condition C can indicate a shallow placement from a direction indicated by the arrow at C, such as after a timeout associated with a place operation by an external robot tool, indicating that at least one wafer 502 was not placed deep enough within passageway 112. Alternatively, sensing condition C can indicate a valid place operation in progress, such as when sensing condition C is observed during the place operation from the direction indicated by the arrow at C, after which sensing condition A is observed, for example. Similarly, sensing condition D can be observed during a pick operation to remove at least one wafer 502 in a direction shown by the arrow at D and can indicate a valid pick operation in progress, such as when followed by sensing condition A after the pick operation is complete. A sensing condition E can indicate a deep placement from a direction indicated by the arrow at E, such as during or after a place operation by an external robot tool, indicating that at least one wafer 502 was placed too deep within passageway 112.

Turning now to FIG. 14, a method 1400 of flipping wafers using retaining assembly 110 is shown in flowchart format. It is noted that some portions of method 1400 may be omitted or rearranged in certain implementations.

Method 1400 may begin at step 1402 by rotating a first pair of retention fingers of a first quartet of retention fingers to a first angular position, each retention finger configured to rotate about an axis at a proximal end and having a resting flexure at a distal end, each resting flexure being vertically and torsionally compliant, where multiple quartets of retention fingers including the first quartet are mounted in a housing to which each of the retention fingers is respectively mounted at the axis. At step 1404, a second pair of retention fingers of the first quartet is rotated to a second angular position, the second pair vertically spaced a first distance from the first pair. At step 1406, a wafer is received through a passageway extending centrally through the housing and being open at a first end and a second end of the housing, the retention fingers being free of the passageway in the second angular position, the wafer being received from the first end and supported at a first side of the wafer by the resting flexures of the first pair, the second pair vertically located to face a second side of the wafer opposite the first side. At step 1408, the second pair is rotated to the first angular position. At step 1410, the second pair is vertically moved towards the wafer in the first angular position to hold the wafer at the second side by the resting flexures of the second pair and at the first side by the resting flexures of the first pair. At step 1412, using a bearing to which the housing is mounted, the housing is turned such that the wafer is flipped 180 degrees when the wafer is held by the first quartet.

As disclosed herein, a wafer handling device includes multiple quartets of retention fingers, each having a resting flexure at a distal end that is vertically and torsionally compliant, a housing to which the retention fingers are mounted, a first pair of the retention fingers from a first quartet, the first pair configured to rotate to a first angular position to receive a wafer by the resting flexures, a second pair of the retention fingers from the first quartet configured to rotate to the first angular position after the first pair receives the wafer, and configured to vertically move towards the wafer in the first angular position, where the device grips the wafer at a second side by the second pair and at a first side by the first pair, and a bearing to which the housing is mounted for turning the housing to overturn the wafer 180 degrees.

Example implementations of the disclosure are described below. Other implementations can also be understood from the entirety of the specification as well as the claims filed herein.

Example 1. A substrate handling device, including: multiple quartets of retention fingers, each retention finger having a resting flexure at a distal end; a first pair of the retention fingers from a first quartet of the multiple quartets, the first pair configured to rotate to a first angular position to receive a wafer by the resting flexures of the first pair; a second pair of the retention fingers from the first quartet, the second pair configured to rotate to a second angular position before the first pair receives the wafer, and to rotate to the first angular position after the first pair receives the wafer, the second pair further configured to vertically move towards the wafer in the first angular position, where the substrate handling device is configured to grip the wafer at a second side by the resting flexures of the second pair and at a first side by the resting flexures of the first pair; and a bearing to which the multiple quartets are mounted, the bearing for collectively turning the multiple quartets to flip the wafer by 180 degrees.

Example 2. The substrate handling device of example 1, where after the multiple quartets are collectively turned, the first pair is configured to vertically move away from the semiconductor substrate in the first angular position and then to rotate to the second angular position, leaving the semiconductor substrate supported by the second pair.

Example 3. The substrate handling device of one of examples 1 or 2, where the multiple quartets are stacked vertically to each other in a housing that collectively turns the multiple quartets, and each quartet is configured to respectively grip an individual semiconductor substrate when the housing is turned.

Example 4. The substrate handling device of one of examples 1 to 3, further including: four driveshafts respectively defining four axes of the quartets about which the retention fingers rotate, where the retention fingers are respectively mounted to a driveshaft of the four driveshafts rotate and vertically translate collectively in unison.

Example 5. The substrate handling device of one of examples 1 to 4, where first two driveshafts corresponding to the first pair of retention fingers are configured to rotate and vertically translate in unison with each other, and second two driveshafts corresponding to the second pair of retention fingers are configured to rotate and vertically translate in unison with each other and independently of the first two driveshafts.

Example 6. The substrate handling device of one of examples 1 to 5, where each of the retention fingers includes two resting flexures.

Example 7. The substrate handling device of one of examples 1 to 6, where each resting flexure is vertically and torsionally compliant to hold the wafer when the wafer is not planar.

Example 8. The substrate handling device of one of examples 1 to 7, where each resting flexure contacts the wafer at an edge exclusion portion of the wafer.

Example 9. The substrate handling device of one of examples 1 to 8, further including: an edge grip flexure included with a retention finger, the edge grip flexure having a boss for contacting the wafer at an edge surface of the wafer.

Example 10. A method, including: rotating a first pair of retention fingers of a first quartet of retention fingers to a first angular position, each retention finger configured to rotate about an axis at a proximal end and having a resting flexure at a distal end, where multiple quartets of retention fingers including the first quartet are mounted in a housing to which each of the retention fingers is respectively mounted at the axis; rotating a second pair of retention fingers of the first quartet to a second angular position, the second pair vertically spaced a first distance from the wafer; receiving a wafer through a passageway extending centrally through the housing and being open at a first end and a second end of the housing, the second pair being free of the passageway in the second angular position, the wafer being received from the first end and supported at a first side of the wafer by the resting flexures of the first pair, the second pair vertically located to face a second side of the wafer opposite the first side; after the first pair receives and supports the wafer, rotating the second pair to the first angular position; vertically moving the second pair towards the wafer over the first distance in the first angular position to hold the wafer at the second side by the resting flexures of the second pair and at the first side by the resting flexures of the first pair; and turning, using a bearing to which the housing is mounted, the housing to overturn the wafer 180 degrees when the wafer is held by the first quartet.

Example 11. The method of example 10, further including: after the housing is turned, vertically moving the first pair away from the wafer in the first angular position; and rotating the first pair to the second angular position, leaving the wafer supported by the second pair.

Example 12. The method of one of examples 10 or 11, where the multiple quartets are stacked vertically to each other in the housing, and each quartet is configured to respectively receive, support, and hold an individual wafer, including holding the individual wafer when the housing is turned.

Example 13. The method of one of examples 10 to 12, where rotating the first pair of retention fingers further includes: rotating the first pair mounted to a first driveshaft of four driveshafts, the first driveshaft defining the axis, where the retention fingers mounted to the first driveshaft rotate and vertically translate collectively in unison.

Example 14. The method of one of examples 10 to 13, where each of the retention fingers includes two resting flexures.

Example 15. The method of one of examples 10 to 14, where each resting flexure is vertically and torsionally compliant to hold the wafer when the wafer is not planar.

Example 16. The method of one of examples 10 to 15, where the wafer being received from the first end and supported at a first side of the wafer by the resting flexures further includes: contacting the wafer, by the resting flexures, at an edge exclusion portion of the wafer.

Example 17. The method of one of examples 10 to 16, further including: contacting the wafer at an edge surface of the wafer using an edge grip flexure included with at least one retention finger, the edge grip flexure having a boss for contacting the wafer.

Example 18. A wafer handling device, including: multiple quartets of retention fingers, each retention finger configured to rotate about an axis at a proximal end and having a resting flexure at a distal end, the resting flexure being vertically and torsionally compliant; a housing to which each of the retention fingers is respectively coupled via the axis; a passageway extending centrally through the housing and being open at a first end and a second end of the housing, the retention fingers having access to the passageway; a first pair of the retention fingers from a first quartet of the multiple quartets, the first pair configured to rotate to a first angular position to receive, in the passageway by the resting flexures of the first pair, a wafer at a first side of the wafer; a second pair of the retention fingers from the first quartet, the second pair configured to rotate to a second angular position free of the passageway before the first pair receives the wafer, and to rotate to the first angular position after the first pair receives the wafer, the second pair configured to vertically move towards the wafer in the first angular position, where the wafer handling device is configured to grip the wafer at a second side by the resting flexures of the second pair and at the first side by the resting flexures of the first pair; and a bearing to which the housing is mounted, the bearing for turning the housing to overturn the wafer by 180 degrees when the wafer is gripped by the first quartet.

Example 19. The wafer handling device of example 18, where the multiple quartets are stacked vertically to each other in the housing, and each quartet is configured to respectively receive an individual wafer, including holding the individual wafer when the housing is turned.

Example 20. The wafer handling device of one of examples 18 or 19, further including: four driveshafts respectively defining four axes of each quartet, where the retention fingers respectively mounted to each driveshaft of the four driveshafts rotate and vertically translate collectively in unison.

While this disclosure has been described with reference to illustrative implementations, this description is not intended to be construed in a limiting sense. Various modifications and combinations of the illustrative implementations, as well as other implementations of the disclosure, will be apparent to persons skilled in the art upon reference to the description. It is therefore intended that the appended claims encompass any such modifications or implementations.

What is claimed is:

1. A substrate handling device, comprising:

multiple quartets of retention fingers, each retention finger having a resting flexure at a distal end;

a first pair of the retention fingers from a first quartet of the multiple quartets, the first pair configured to rotate to a first angular position to receive a wafer by the resting flexures of the first pair;

a second pair of the retention fingers from the first quartet, the second pair configured to rotate to a second angular position before the first pair receives the wafer, and to rotate to the first angular position after the first pair receives the wafer, the second pair further configured to vertically move towards the wafer in the first angular position, wherein the substrate handling device is configured to grip the wafer at a second side by the resting flexures of the second pair and at a first side by the resting flexures of the first pair; and a bearing to which the multiple quartets are mounted, the bearing for collectively turning the multiple quartets to flip the wafer by 180 degrees.

2. The substrate handling device of claim 1, wherein after the multiple quartets are collectively turned, the first pair is configured to vertically move away from the wafer in the first angular position and then to rotate to the second angular position, leaving the wafer supported by the second pair.

3. The substrate handling device of claim 1, wherein the multiple quartets are stacked vertically to each other in a housing that collectively turns the multiple quartets, and each quartet is configured to respectively grip an individual semiconductor substrate when the housing is turned.

4. The substrate handling device of claim 3, further comprising:

four driveshafts respectively defining four axes of the quartets about which the retention fingers rotate, wherein the retention fingers are respectively mounted to a driveshaft of the four driveshafts rotate and vertically translate collectively in unison.

5. The substrate handling device of claim 4, wherein first two driveshafts corresponding to the first pair of retention fingers are configured to rotate and vertically translate in unison with each other, and second two driveshafts corresponding to the second pair of retention fingers are configured to rotate and vertically translate in unison with each other and independently of the first two driveshafts.

6. The substrate handling device of claim 1, wherein each of the retention fingers comprises two resting flexures.

7. The substrate handling device of claim 1, wherein each resting flexure is vertically and torsionally compliant to hold the wafer when the wafer is not planar.

8. The substrate handling device of claim 1, wherein each resting flexure contacts the wafer at an edge exclusion portion of the wafer.

9. The substrate handling device of claim 1, further comprising:

an edge grip flexure included with a retention finger, the edge grip flexure having a boss for contacting the wafer at an edge surface of the wafer.

10. A method, comprising:

rotating a first pair of retention fingers of a first quartet of retention fingers to a first angular position, each retention finger configured to rotate about an axis at a proximal end and having a resting flexure at a distal end, wherein multiple quartets of retention fingers including the first quartet are mounted in a housing to which each of the retention fingers is respectively mounted at the axis;

rotating a second pair of retention fingers of the first quartet to a second angular position, the second pair vertically spaced a first distance from a wafer;

receiving the wafer through a passageway extending centrally through the housing and being open at a first end and a second end of the housing, the second pair being free of the passageway in the second angular position, the wafer being received from the first end and supported at a first side of the wafer by the resting flexures of the first pair, the second pair vertically located to face a second side of the wafer opposite the first side;

after the first pair receives and supports the wafer, rotating the second pair to the first angular position;

vertically moving the second pair towards the wafer over the first distance in the first angular position to hold the wafer at the second side by the resting flexures of the second pair and at the first side by the resting flexures of the first pair; and turning, using a bearing to which the housing is mounted, the housing to overturn the wafer 180 degrees when the wafer is held by the first quartet.

11. The method of claim 10, further comprising:

after the housing is turned, vertically moving the first pair away from the wafer in the first angular position; and rotating the first pair to the second angular position, leaving the wafer supported by the second pair.

12. The method of claim 10, wherein the multiple quartets are stacked vertically to each other in the housing, and each quartet is configured to respectively receive, support, and hold an individual wafer, including holding the individual wafer when the housing is turned.

13. The method of claim 10, wherein rotating the first pair of retention fingers further comprises:

rotating the first pair mounted to a first driveshaft of four driveshafts, the first driveshaft defining the axis, wherein the retention fingers mounted to the first driveshaft rotate and vertically translate collectively in unison.

14. The method of claim 10, wherein each of the retention fingers comprises two resting flexures.

15. The method of claim 10, wherein each resting flexure is vertically and torsionally compliant to hold the wafer when the wafer is not planar.

16. The method of claim 10, wherein the wafer being received from the first end and supported at a first side of the wafer by the resting flexures further comprises:

contacting the wafer, by the resting flexures, at an edge exclusion portion of the wafer.

17. The method of claim 10, further comprising:

contacting the wafer at an edge surface of the wafer using an edge grip flexure included with at least one retention finger, the edge grip flexure having a boss for contacting the wafer.

18. A wafer handling device, comprising:

multiple quartets of retention fingers, each retention finger configured to rotate about an axis at a proximal end and having a resting flexure at a distal end, the resting flexure being vertically and torsionally compliant;

a housing to which each of the retention fingers is respectively coupled via the axis;

a passageway extending centrally through the housing and being open at a first end and a second end of the housing, the retention fingers having access to the passageway;

a first pair of the retention fingers from a first quartet of the multiple quartets, the first pair configured to rotate to a first angular position to receive, in the passageway by the resting flexures of the first pair, a wafer at a first side of the wafer;

a second pair of the retention fingers from the first quartet, the second pair configured to rotate to a second angular position free of the passageway before the first pair receives the wafer, and to rotate to the first angular position after the first pair receives the wafer, the second pair configured to vertically move towards the wafer in the first angular position, wherein the wafer handling device is configured to grip the wafer at a second side by the resting flexures of the second pair and at the first side by the resting flexures of the first pair; and a bearing to which the housing is mounted, the bearing for turning the housing to overturn the wafer by 180 degrees when the wafer is gripped by the first quartet.

19. The wafer handling device of claim 18, wherein the multiple quartets are stacked vertically to each other in the housing, and each quartet is configured to respectively receive an individual wafer, including holding the individual wafer when the housing is turned.

20. The wafer handling device of claim 19, further comprising:

four driveshafts respectively defining four axes of each quartet, wherein the retention fingers respectively mounted to each driveshaft of the four driveshafts rotate and vertically translate collectively in unison.

* * * * *